US009389376B2

(12) United States Patent
Sunaga et al.

(10) Patent No.: US 9,389,376 B2
(45) Date of Patent: Jul. 12, 2016

(54) OPTICAL TRANSMISSION MODULE

(71) Applicant: Hitachi Metals, Ltd., Minato-ku, Tokyo (JP)

(72) Inventors: Yoshinori Sunaga, Hitachinaka (JP); Kinya Yamazaki, Hitachi (JP); Koki Hirano, Hitachinaka (JP); Hiroki Yasuda, Mito (JP)

(73) Assignee: Hitachi Metals, Ltd., Tokyo (JP)

( * ) Notice: Subject to any disclaimer, the term of this patent is extended or adjusted under 35 U.S.C. 154(b) by 0 days.

(21) Appl. No.: 14/705,372

(22) Filed: May 6, 2015

(65) Prior Publication Data

US 2015/0338586 A1    Nov. 26, 2015

(30) Foreign Application Priority Data

May 23, 2014   (JP) .................................. 2014-107594

(51) Int. Cl.
    *G02B 6/42*     (2006.01)
    *H01L 31/0232*  (2014.01)
    *H01S 5/022*    (2006.01)

(52) U.S. Cl.
    CPC ............ *G02B 6/4245* (2013.01); *G02B 6/4214* (2013.01); *G02B 6/4259* (2013.01); *G02B 6/4292* (2013.01); *H01L 31/0232* (2013.01); *H01S 5/022* (2013.01); *G02B 6/423* (2013.01); *G02B 6/425* (2013.01)

(58) Field of Classification Search
    None
    See application file for complete search history.

(56) References Cited

U.S. PATENT DOCUMENTS

| | | | | |
|---|---|---|---|---|
| 5,168,537 A * | 12/1992 | Rajasekharan et al. | G02B 6/32 | 385/89 |
| 5,790,730 A * | 8/1998 | Kravitz et al. | G02B 6/30 | 385/14 |
| 7,004,644 B1 * | 2/2006 | Johnson | G02B 6/4204 | 257/680 |
| 7,210,861 B2 * | 5/2007 | Nagasaka et al. | G02B 6/4292 | 385/88 |
| 7,918,610 B2 * | 4/2011 | Fujiwara et al. | G02B 6/4214 | 385/49 |
| 2003/0127661 A1 * | 7/2003 | Takagi | H01S 5/02415 | 257/98 |
| 2004/0202477 A1 * | 10/2004 | Nagasaka et al. | G02B 6/4292 | 398/138 |
| 2005/0189549 A1 * | 9/2005 | Malone et al. | G02B 6/4201 | 257/82 |
| 2005/0213882 A1 * | 9/2005 | Go et al. | G02B 6/4201 | 385/37 |
| 2010/0028017 A1 * | 2/2010 | Mizoguchi | G02B 6/3817 | 398/141 |
| 2012/0195545 A1 * | 8/2012 | Yasuda et al. | G02B 6/4214 | 385/14 |
| 2015/0338275 A1 * | 11/2015 | Sunaga et al. | G01J 1/44 | 250/214 A |

FOREIGN PATENT DOCUMENTS

JP        2006-23777 A       1/2006

* cited by examiner

*Primary Examiner* — Mike Stahl
(74) *Attorney, Agent, or Firm* — Crowell & Moring LLP

(57) ABSTRACT

An optical transmission module includes a first member having a bottom portion, sidewalls and an opening, a second member joined to a sidewall end surface of the first member and sealing the opening, a connector member attachable to and detachable from the second member, a light-emitting element mounted on an inner surface of the second member, an interconnection formed on the inner surface and extending inside and outside the first member across the sidewalls of the first member, and electrodes formed on outer surfaces of the sidewalls. The second member transmits therethrough light outputted from the light-emitting element. One end portion of the electrode is electrically connected to one end portion of the interconnection extending outside the first member. The other end of the electrode is soldered to an interconnection formed on a substrate surface on which the optical transmission module is mounted.

6 Claims, 10 Drawing Sheets

FIG. 7
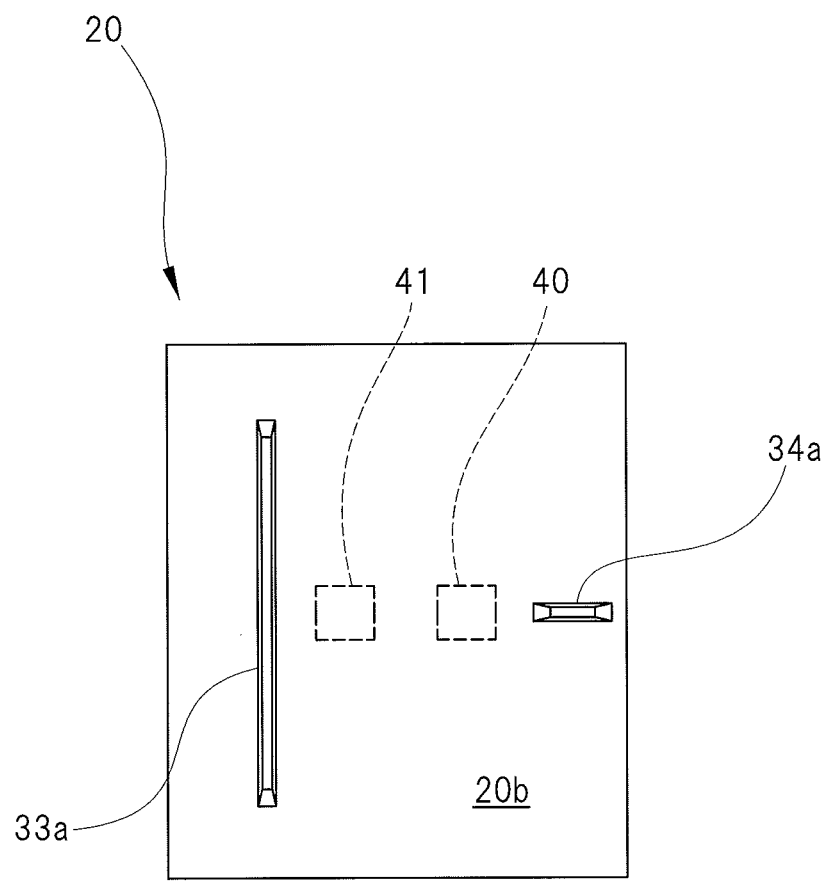
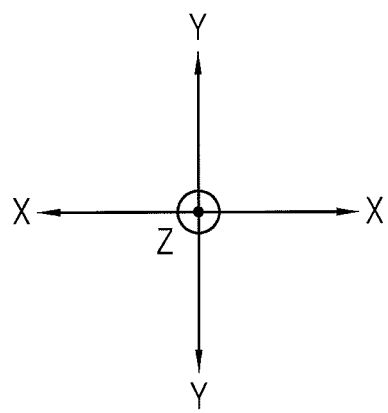

OPTICAL TRANSMISSION MODULE

CROSS-REFERENCE TO RELATED APPLICATIONS

The present application claims priority from Japanese Patent Application No. 2014-107594 filed on May 23, 2014, the content of which is hereby incorporated by reference to this application.

TECHNICAL FIELD

The present invention relates to an optical transmission module for converting electric signals to optical signals, or converting optical signals to electric signals.

BACKGROUND

The amount of information to be processed in electronic devices has been increased year by year. Along with the increase of the amount of information, optical transmission has been used in information transmission (signal transmission) at a short distance inside electronic devices. The reason for using optical interconnections (optical fibers) used in the optical transmission are that they are thinner, easier to bend, and more tolerant to noise than metal wires used in electric transmission. In addition, optical transmission has such an advantage that power consumption is less than that of electric transmission, particularly in high-speed transmission.

In such optical transmission, an optical transmission module for converting electric signals to optical signals or converting optical signals to electric signals is used. That is, an optical transmission module with a photoelectric conversion function is used in the optical transmission. More specifically, a communication chip and an optical transmission module are mounted on a substrate included in an electronic device. Such an optical transmission module converts electric signals inputted from the communication chip to optical signals or converts optical signals inputted externally to electric signals (Patent Document 1: Japanese Patent Application Laid-Open Publication No. 2006-23777).

Under these circumstances, the optical transmission module used in the optical transmission is required to further reduce a mounting space or the cost.

SUMMARY

However, many of the optical fibers connected to an optical transmission module are coated by protective resin. Thus, optical fibers are generally weak against heat. In addition, a high-precision resin part or adhesive are used at connection portions between the optical transmission module and optical fiber, and thus such connection portions are also weak against heat. Therefore, an electric connector has been used so as to connect an optical transmission module and a substrate. That is, the electric connector has been necessary to mount the optical transmission module on the substrate. Thus, amounting space for the optical transmission module has been increased, and also the cost has been increased. Particularly, as to a large optical transmission module of 10 channels (ch) or more, although influences resulting from an increase of the mounting space and from an increase of the cost as a result of using the electric connector become relatively smaller, such influences resulting from an increase of the mounting space and from an increase of the cost as a result of using the electric connector become relatively bigger, as to a small optical transmission module of several channels (ch).

A preferred aim of the present invention is to achieve an optical transmission module that is mountable on a surface of a substrate and other mounting surfaces without using an electric connector.

An optical transmission module according to the present invention is an optical transmission module including an optical element with a photoelectric conversion function. This optical transmission module includes: a first member having a bottom portion and sidewalls, and one surface with an opening; a second member joined to an end surface of the sidewall of the first member and sealing the opening of the first member; a connector member, which is attachable to and detachable from the second member, having an optical interconnection connected thereto; the optical element mounted on an inner surface of the second member that faces an inner surface of the bottom portion of the first member; an interconnection formed on the inner surface of the second member and extending inside and outside the first member across the sidewalls of the first member; and electrodes formed on outer surfaces of the sidewalls of the first member. The second member transmits therethrough at least one of light outputted from the optical element and light to be incident on the optical element. The connector member converts a traveling direction of light transmitted through the second member to make the light incident on the connected optical interconnection, or converts a traveling direction of light outputted from the connected optical interconnection to make the light incident on the second member. One end portion of the electrode is electrically connected to one end portion of the interconnection extending outside the first member, and the other end portion of the electrode is soldered to an interconnection or an electrode formed on a mounting surface on which the optical transmission module is mounted.

According to an aspect of the present invention, a plurality of engaging units for defining a relative positional relationship between the second member and the connector member are provided.

According to another aspect of the present invention, the connector member is mounted on an outer surface of the second member on a side opposite to the inner surface of the second member. In this aspect, a first engaging unit for defining a relative positional relationship between the second member and the connector member in an X direction that is parallel to the outer surface of the second member is provided, a second engaging unit for defining a relative positional relationship between the second member and the connector member in a Y direction that is parallel to the outer surface of the second member and orthogonal to the X direction is provided, and a third engaging unit for defining a relative positional relationship between the second member and the connector member in a Z direction that is perpendicular to the outer surface of the second member is provided.

According to still another aspect of the present invention, each of the first engaging unit and the second engaging unit includes a concave and a convex formed on the outer surface of the second member and on a bottom surface of the connector member facing the outer surface. The third engaging unit is formed integrally with the connector member, and includes a claw that is engageable with and releasable from the second member.

According to still another aspect of the present invention, each of the first engaging unit and the second engaging unit includes a groove that is formed on the outer surface of the second member, and a protrusion that is formed on the bottom surface of the connector member and fitted with the groove. The claw included in the third engaging unit is elastically deformable to be into a state of being engaged with the second member and a state of being released from engagement with the second member.

According to still another aspect of the present invention, each of the first engaging unit and the second engaging unit includes a concave and a convex formed on the outer surface of the second member, and a bottom surface of the connector member facing the outer surface. The third engaging unit includes a fixture which is provided across the second member and the connector member and separated from the connector member.

According to the present invention, without using an electric connector, an optical transmission module that is mountable on a surface of a substrate and other mounting surfaces is achieved.

BRIEF DESCRIPTION OF THE DRAWINGS

FIG. 7 is a plan view of an outer surface of the second member;

DETAILED DESCRIPTION

Hereinafter, an example of an embodiment of the present invention will be described in detail with reference to the drawings. An optical transmission module 1 illustrated in FIG. 1 is an example of an optical transmission module in which the present invention is used.

Figure 1:
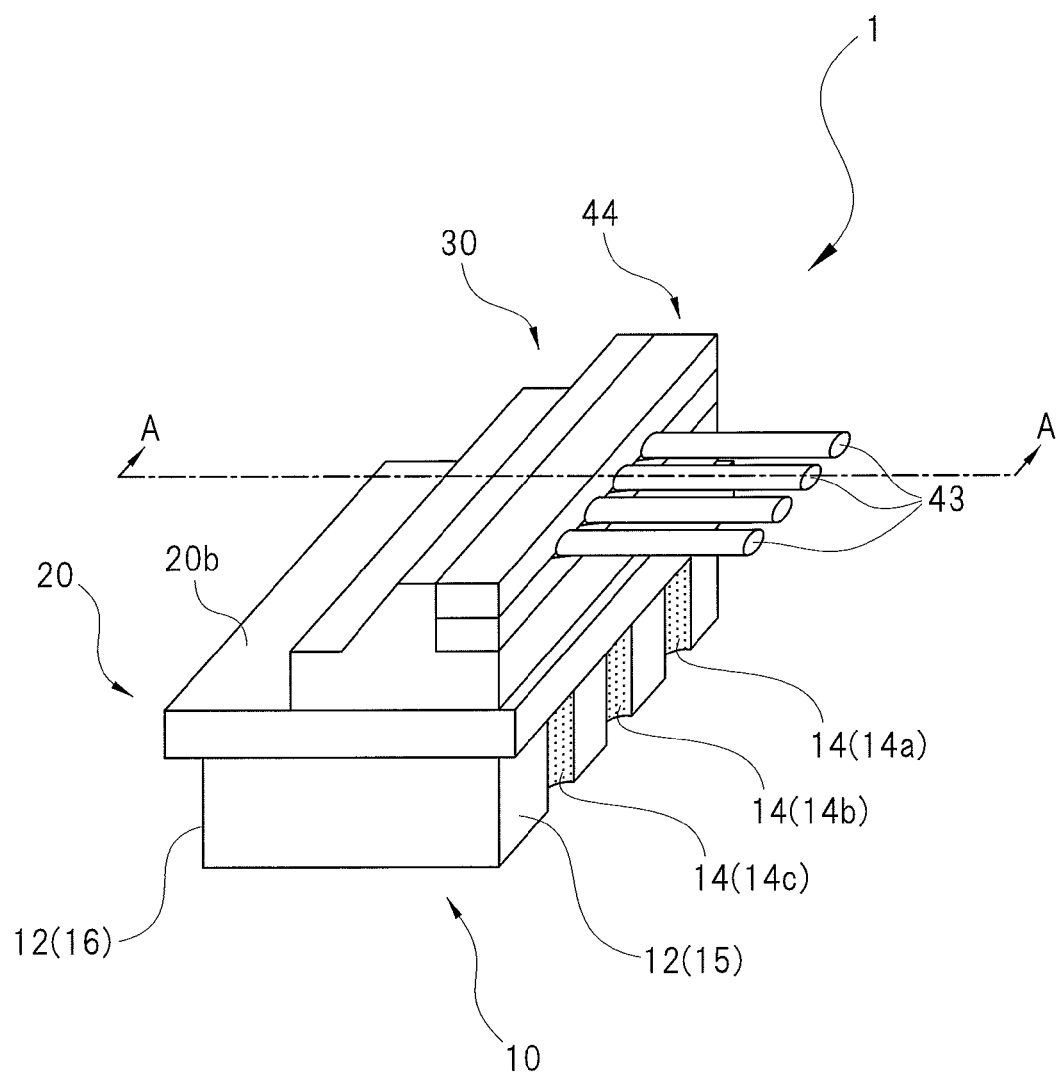
FIG. 1 is a perspective view illustrating an example of an optical transmission module in which the present invention is used.

The optical transmission module 1 illustrated in FIG. 1 includes a first member 10, a second member 20 and a connector member 30. The first member 10 and the second member 20 are formed of only an inorganic material. More specifically, the first member 20 and the second member 20 are formed of silicon (Si). On the other hand, the connector 30 is formed of a resin material.

Figure 2:
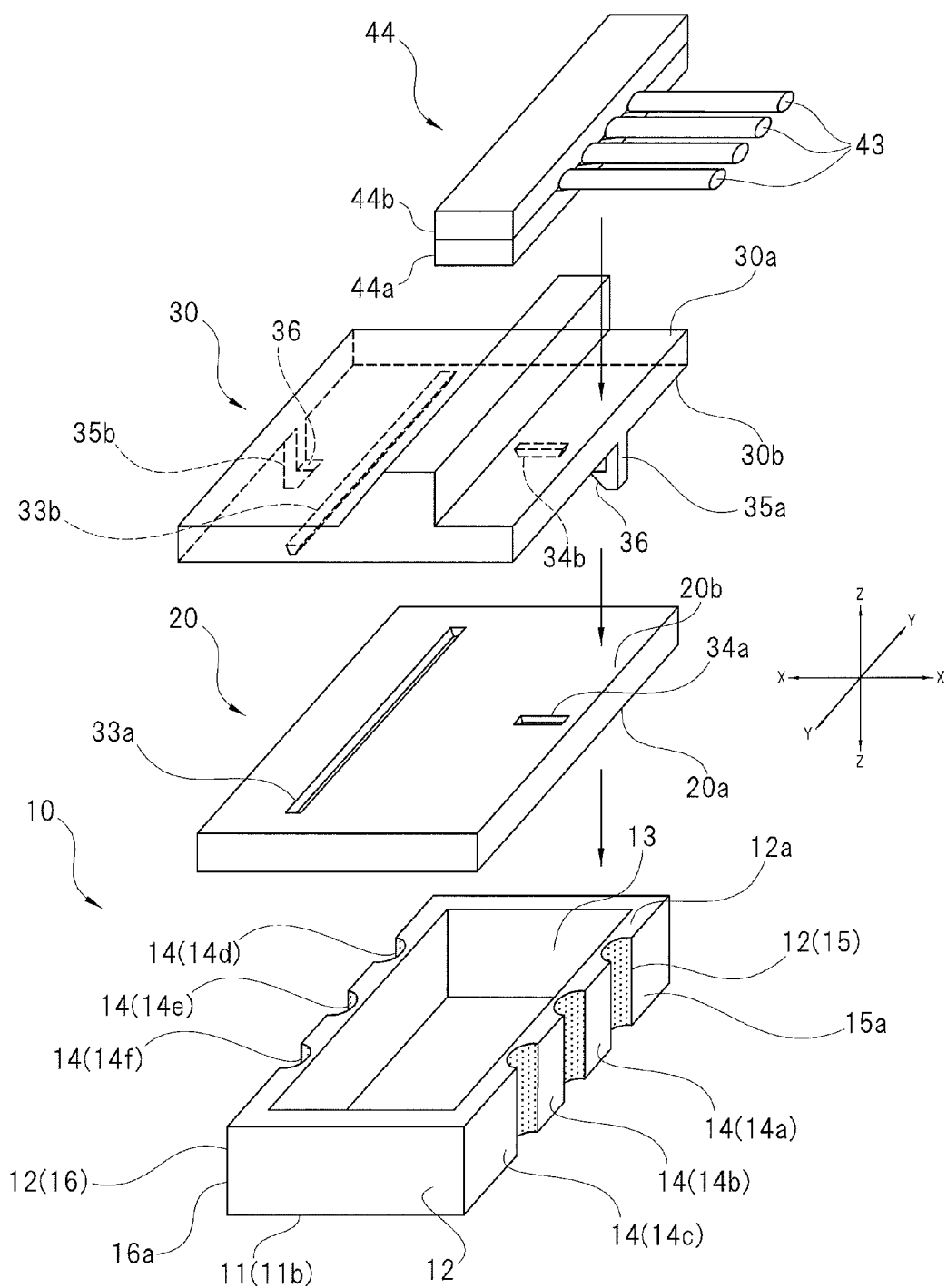
FIG. 2 is an exploded perspective view of the optical transmission module illustrated in FIG. 1.

As illustrated in FIG. 2, the first member 10 has a bottom portion 11 and sidewalls 12, and is formed in a box shape having one surface with an opening. In other words, the first member 10 has the bottom portion 11, the sidewalls 12, and an opening 13. Further, on an outer surface of the two facing sidewalls 12 of the first member 10, a plurality of electrodes 14 are formed. More specifically, electrodes 14a, 14b and 14c are formed on an outer surface of one of the sidewalls 12, and electrodes 14d, electrodes 14e and 14f are formed on an outer surface of the other one of the sidewalls 12.

In the following description, the sidewall 12 of the first member 10 on which the electrodes 14a, 14b and 14c are formed will be called "right sidewall 15" in some cases, and the sidewall 12 of the first member 10 on which the electrodes 14d, 14e and 14f are formed will be called "left sidewall 16" in some cases. In addition, an outer surface of the right sidewall 15 will be called "outer surface 15a" in some cases and an outer surface of the left sidewall 16 will be called "outer surface 16a" in some cases. Meanwhile, the four sidewalls of the first member 10 including the right sidewall 15 and the left sidewall 16 will be collectively called "sidewalls 12" in some cases. Further, the outer surface of the sidewalls 12 including the outer surface 15a and the outer surface 16a will be collectively called "outer surface of sidewall" in some cases. Moreover, the electrodes 14a to 14f will be collectively called "electrodes 14" in some cases.

Figure 3:
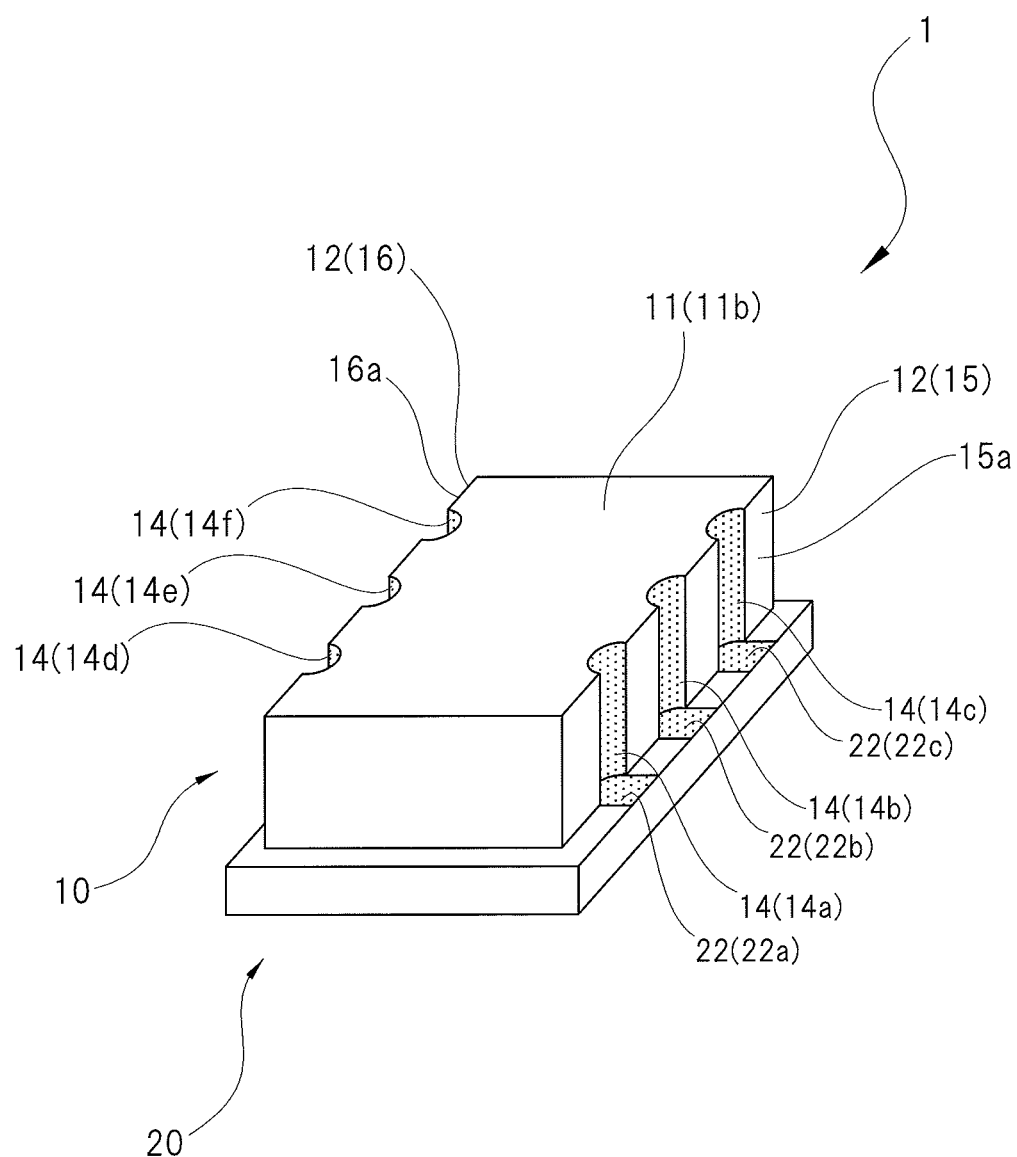
FIG. 3 is a bottom perspective view of the optical transmission module illustrated in FIG. 1.

The electrodes 14 include concave grooves, having a semi-circular arc-shaped cross section, formed on the outer surfaces 15a and 16a, and a conductive layer formed on the surfaces of the concave grooves. Each of the electrodes 14 extends in a height direction of the sidewalls 12 (top-bottom direction in FIG. 2), having one end that reaches an end surface 12a of the sidewall 12 (FIG. 2) and the other end that reaches an outer surface 11b of the bottom portion 11 (FIG. 3). Note that the connector member 30 illustrated in FIGS. 1 and 2 is not illustrated in FIG. 3.

Figure 4:
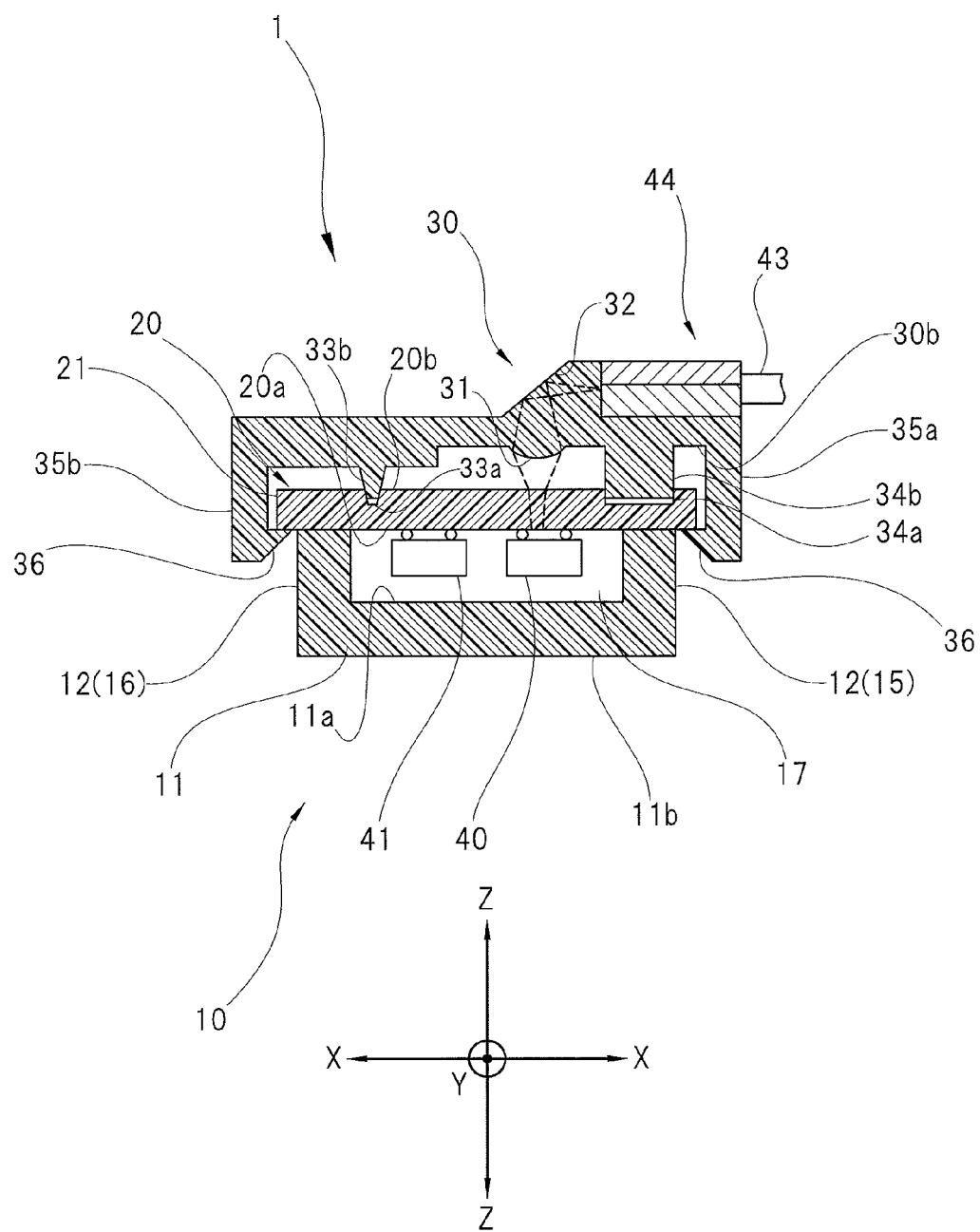
FIG. 4 is a cross-sectional view taken along the line A-A illustrated in FIG. 1.

As illustrated in FIGS. 1 and 2, the second member 20 is a plate-like member in a substantially rectangular shape and joined to the end surface 12a of the sidewall 12 to seal the opening 13 of the first member 10. Thus, as illustrated in FIG. 4, a closed space 17 is formed inside the first member 10. The second member 20 of the present embodiment is directly joined to the sidewall end surface 12a of the first member 10 by plasma activation low-temperature joint. Thus, the opening 13 of the first member 10 illustrated in FIG. 2 is air-tightly sealed by the second member 20. In other words, the closed space 17 illustrated in FIG. 4 is an air-tight space.

As illustrated in FIG. 4, an inner surface 20a of the second member 20 faces an inner surface 11a of the bottom portion 11 of the first member 10. In other words, of two main surfaces of the second member 20, the main surface facing the bottom portion inner surface 11a of the first member 10 is the inner surface 20a, and the main surface on the side opposite to the inner surface 20a is an outer surface 20b. Here, the second member 20 is preferable to be the same in size as the first member 10 or slightly larger than the first member 10. The second member 20 according to the present embodiment is slightly larger than the first member 10. Thus, a rim portion 21 of the second member 20 joined to the sidewall end surface 12a (FIG. 2) of the first member 10 is protruded in a flange-like manner to the outside of the first member 10.

Figure 5:
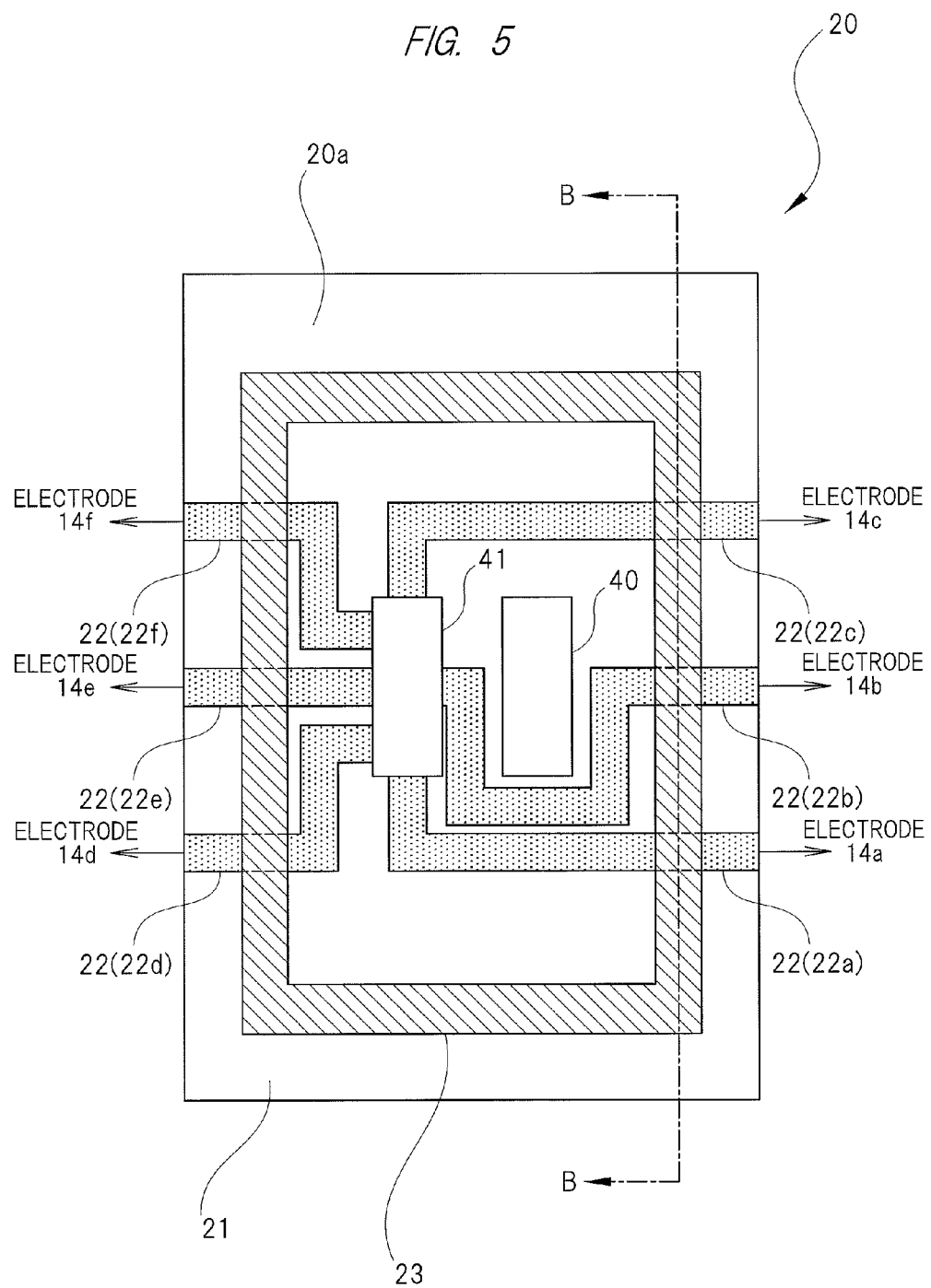
FIG. 5 is an enlarged plan view of an inner surface of a second member.

FIG. 5 is an enlarged plan view schematically illustrating the inner surface 20a of the second member 20. As illustrated in FIG. 5, on the inner surface 20a of the second member 20, an optical element with a photoelectric conversion function ("the light-emitting element 40" in the specification) and a driver element 41 which drives the light-emitting element 40 are flip-chip mounted, and they are electrically connected to each other.

As illustrated in FIG. 4, the light-emitting element 40 and the driver element 41, both of which are mounted on the inner surface 20a of the second member 20, are disposed inside the first member 10. That is, the light-emitting element 40 and the driver element 41 are contained in the closed space 17 that is air-tightly sealed by the second member 20. The light-emitting element 40 according to the present embodiment is a vertical cavity surface emitting laser (VCSEL) and its light-output surface faces the inner surface 20a of the second member 20. Meanwhile, the second member 20 has an optical characteristic of transmitting light outputted from the light-emitting element 40 therethrough. That is, the second member 20 is transparent to a wavelength of the light outputted from the light-emitting element 40. Note that, a central wavelength of the light outputted from the light-emitting element 40 in the present embodiment is 1050 nm. However, the phrase "the second member 20 is transparent to a wavelength of the light outputted from the light-emitting element 40" does not only refer to transmitting the light outputted from the light-emitting element 40 therethrough without loss. When the light, which is outputted from the light-emitting element 40 and transmitted through the second member 20, maintains the necessary and sufficient optical intensity (signal intensity), the second member 20 is transparent to the wavelength of the light outputted from the light-emitting element 40.

Referring to FIG. 5 again, on the inner surface 20a of the second member 20, a plurality of interconnections 22 for connecting the driver element 41 and a predetermined electrode 14 (FIG. 2) are formed. More specifically, on the inner surface 20a of the second member 20, at least interconnections 22a, 22b, 22c, 22d, 22e and 22f are formed. Each of the interconnections extends between the driver element 41 disposed at substantially the center of the inner surface 20a of the second member 20 and a rim (longer side) of the inner surface 20a, and some of the interconnections 22 reach the rim of the inner surface 20a while going around the light-emitting element 40. Note that the interconnection pattern illustrated in FIG. 5 is merely an example.

Figure 6:
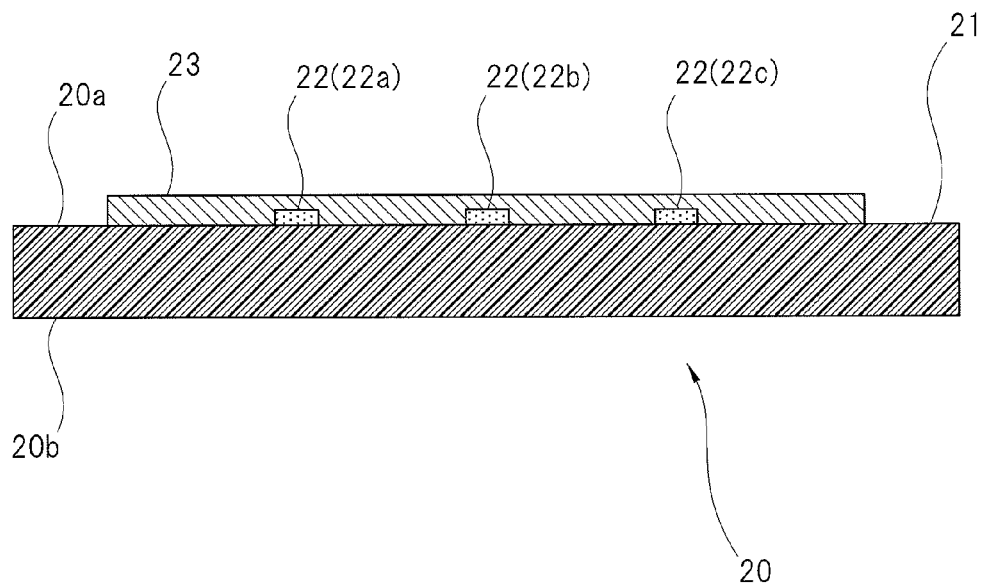
FIG. 6 is a cross-sectional view taken along the line B-B illustrated in FIG. 5.

Further, on the inner surface 20a of the second member 20, an insulating layer 23 in a frame-like shape is formed. The insulating layer 23 is formed inside the rim portion 21 of the second member 20 along the rim portion 21, and partially crossed with the interconnections 22. As illustrated in FIG. 6, the insulating layer 23 covers the interconnections 22 at crossing portions crossed with each of the interconnections 22. The insulating layer 23 has substantially the same shape and size as those of the sidewall end surface 12a (FIG. 2) of the first member 10. The sidewall end surface 12a is joined to a surface of the insulating layer 23. That is, an area around the insulating layer 23 illustrated in FIG. 5 is the rim portion 21 of the second member 20. Note that the insulating layer 23 in the present embodiment is formed of silicon dioxide ($SiO_2$).

As illustrated in FIG. 5, each of the interconnections 22 reaches the rim of the inner surface 20a of the second member 20 over the rim portion 21 of the second member 20. In other words, each of the interconnections 22 extends inside and outside of the first member 10 across the right sidewall 15 and the left sidewall 16 (FIG. 2) of the first member 10. As illustrated in FIG. 3, one end portion of each of the interconnections 22 extending outside the first member 10 is connected to the electrode 14 to be electrically conducted thereto. In the present embodiment, an end portion of each of the interconnections 22 and an end portion of each of the electrodes 14 are soldered. More specifically, as illustrated in FIG. 5, one end portion of each of the interconnections 22 is connected to the driver element 41. On the other hand, the other end portion of the interconnection 22a is connected to the electrode 14a, the other end portion of the interconnection 22b is connected to the electrode 14b, and the other end portion of the interconnection 22c is connected to the electrode 14c. In addition, the other end portion of the interconnection 22d is connected to the electrode 14d, the other end portion of the interconnection 22e is connected to the electrode 14e, and the other end portion of the interconnection 22f is connected to the electrode 14f. Note that, in the present embodiment, the electrodes 14a, 14b, 14d and 14e are used for signals, and the electrode 14f is used for power source, and the electrode 14c is used for the ground.

As illustrated in FIG. 1, on the outer surface 20b of the second member 20, a connector member 30 that is separated from the first member 10 and the second member 20 is mounted. As illustrated in FIG. 2, the connector member 30 is mounted on the second member 20 such that a bottom surface 30b of the connector member 30 faces the outer surface 20b of the second member 20. Note that the connector member 30 is not permanently fixed to the second member 20, but attachable to and detachable from the second member 20. On the other hand, on an upper surface 30a of the connector member 30 on the side opposite to the bottom surface 30b, a fiber-holding member 44 attached to an end portion of the optical fiber 43 is mounted and fixed thereto. The fiber holding member 44 has a lower member 44a having a V-groove formed therein and in which the optical fibers 43 are disposed, and has an upper member 44b laminated on the lower member 44a and holding the optical fibers 43 between the lower member 44a and the upper member 44b.

As illustrated in FIG. 4, the connector member 30 has a collecting lens 31 and a mirror 32, and converts a travelling direction of the light that is outputted from the light-emitting element 40 and transmitted through the second member 20 by 90 degrees to make the light incident on the optical fiber 43. That is, the connector member 30 optically couples the light-emitting element 40 and the optical fiber 43.

In the optical transmission module 1 according to the first embodiment, a plurality of engaging units are provided for defining a relative position relationship between the second member 20 and the connector member 30 so that the light-emitting element 40 and the optical fiber 43 are efficiently optically-coupled. Hereinafter, the engaging unit will be described more specifically.

As illustrated in FIG. 2, on the outer surface 20b of the second member 20, a V-groove 33a included in a first engaging unit is formed. A protrusion 33b included in the first engaging unit together with the V-groove 33a is formed on the bottom surface 30b of the connector member 30. Also, on the outer surface 20b of the second member 20, a V-groove 34a included in a second engaging unit is formed. A protrusion 34b included in the second engaging unit together with the V-groove 34a is formed on the bottom surface 30b of the connector member 30. That is, the first engaging unit and the second engaging unit include a plurality of concaves and convexes formed on the outer surface 20b of the second member 20 and on the bottom surface 30b of the connector member 30 facing the outer surface 20b. Further, in the connector member 30, a pair of claws 35a and 35b included in a third engaging unit are integrally formed. As described later, the claws 35a and 35b are engageable with and releasable from the second member 20.

As illustrated in FIGS. 2 and 7, the V-groove 33a included in the first engaging unit extends in parallel with the longitudinal direction of the second member 20. The V-groove 34a included in the second engaging unit extends in a direction orthogonal to the V-groove 33a. In addition, as illustrated in FIG. 2, the protrusion 33b included in the first engaging unit extends in the same direction as the V-groove 33a. The protrusion 34b included in the second engaging unit extends in the same direction as the V-groove 34a. In the following description, the direction in which the V-groove 33a and the protrusion 33b included in the first engaging unit extend is defined as "Y direction", the direction in which the V-groove 34a and the protrusion 34b included in the second engaging unit extend is defined as "X direction", and the direction that is orthogonal to the Y direction and the X direction is defined as "Z direction". In other words, the Y and X directions are parallel to the outer surface 20b of the second member 20 while the Z direction is perpendicular to the outer surface 20b of the second member 20.

As illustrated in FIG. 2, a pair of claws 35a and 35b included in the third engaging unit are respectively provided at both sides in the X direction of the connector member 30, and they face each other. In addition, an engaging protrusion 36 protruded towards the inside of the X direction is provided at a tip (bottom end) of each of the claws 35a and 35b.

As illustrated in FIG. 4, when the connector member 30 is mounted on the second member 20, the protrusions 33b and 34b protruded from the bottom surface 30b of the connector member 30 are fitted with the V-grooves 33a and 34a formed on the outer surface 20b of the second member 20, respectively. Then, the V-groove 33a and the protrusion 33b fitted with the V-groove 33a limit shifting in the X direction of the connector member 30 with respect to the second member 20. That is, the relative positional relationship in the X direction between the second member 20 and the connector member 30 is defined. Also, the V-groove 34a and the protrusion 34b fitted with the V-groove 34a limit shifting in the Y direction of the connector member 30 with respect to the second member 20. That is, the relative positional relationship in the Y direction between the second member 20 and the connector member 30 is defined.

At the same time, the claws 35a and 35b extending from the connector member 30 are engaged with the second member 20. Then, by the claws 35a and 35b provided across the connector member 30 and the second member 20, shifting in the Z direction of the connector member 30 with respect to the second member 20 is limited. That is, the relative positional relationship in the Z direction between the second member 20 and the connector member 30 is defined. More specifically, a tapered surface is provided to each of the engaging protrusions 36 of the claws 35a and 35b. When the connector member 30 is mounted on the second member 20, the tapered surface of each of the engaging protrusions 36 abuts a rim (corner) of the outer surface 20b of the second member 20. Then, when the connector member 30 is pressed against the second member 20, each of the claws 35a and 35b is elastically deformed towards the outside in the X direction. That is, the interval between the protrusion 36 of the claw 35a on one side and the protrusion 36 of the claw 35b on the other side extends. When the connector member 30 is further pressed against the second member 20, each of the protrusions 36 of the claws 35a and 35b passes the side surface of the second member 20 and reaches the inner surface 20a side of the second member 20. Then, each of the claws 35a and 35b is elastically deformed towards the inside in the X direction by the elastic restoring force of the claws 35a and 35b, thereby engaging each of the engaging protrusions 36 with the second member 20. More specifically, each of the protrusions 36 is engaged with the rim portion 21 of the second member 20.

As described above, positioning of the connector member 30 mounted on the second member 20 is decided in three directions of the X, Y and Z directions by the first, second and third engaging units. Note that it is clear that the engagement between the claws 35a and 35b and the second member 20 is released when each of the claws 35a and 35b is elastically deformed towards the outside in the X direction. That is, the claws 35a and 35b are elastically deformable to be into a state of being engaged with the second member 20 and a state of being released from engagement with the second member 20.

Figure 8:
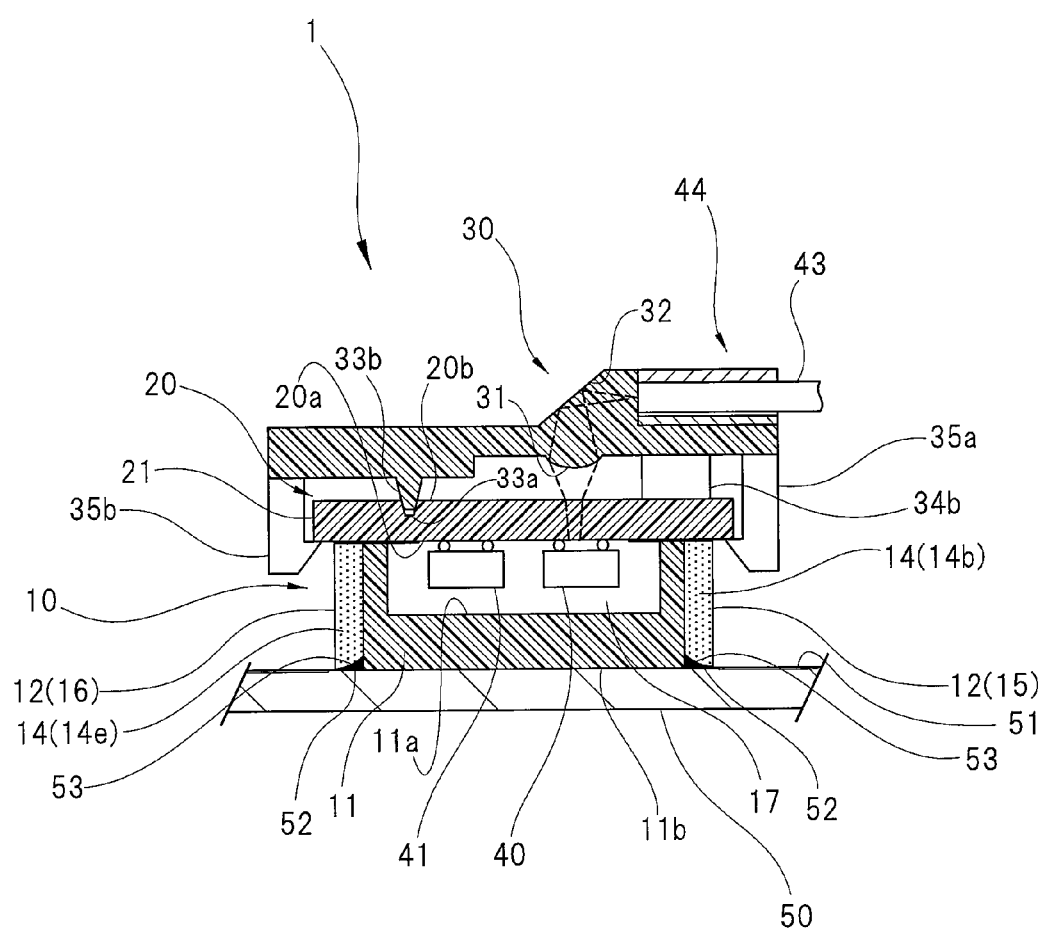
FIG. 8 is a cross-sectional view illustrating a state of mounting the optical transmission module illustrated in FIG. 1.

FIG. 8 illustrates the optical transmission module 1 mounted on a substrate 50 included in an electronic device.

Upon mounting the optical transmission module 1 on the substrate 50, the first member 10 and the second member 20 integrated together are mounted on a substrate surface 51 while the first member 10 is thereunder. Then, the bottom-portion outer surface 11b of the first member 10 faces the substrate surface 51 that is the mounting surface. Here, the plurality of electrodes 14 are formed on the right sidewall 15 and the left sidewall 16 of the first member 10, and one ends of the electrodes 14 reach the bottom-portion outer surface 11b. Thus, by soldering the electrodes 14 included in the first member 10 and the interconnections 52 formed on the substrate surface 51, the electrodes 14 and the interconnections 52 can be electrically connected. More specifically, by soldering the entire bottom of the first member 10 to the substrate surface 51, the first member 10 and the second member 20 are fixed to the substrate surface 51, and the electrodes 14 and the interconnections 52 are electrically connected by a meniscus 53 of solder formed between the electrodes 14 and the interconnections 52.

After fixing the first member 10 and the second member 20 to the substrate 50 as described above, the connector member 30 to which the fiber-holding portion 44 for holding the optical fiber 43 is fixed is mounted on the second member 20. However, the fiber holding member 44 may be fixed to the connector member 30 after the connector member 30 is mounted on the second member 20.

As described above, the optical transmission module 1 according to the present embodiment can be directly mounted on a mounting surface without using any electric connectors. Thus, the mounting space is reduced and the cost can be reduced.

Further, as the first member 10 and the second member 20 of the present embodiment are formed of only an inorganic material, any organic solvent etc. are not vaporized even when the first member 10 and the second member 20 are heated. In addition, as the closed space 17 which contains the light-emitting element 40 and the driver element 41 is air-tightly sealed, vaporized organic solvent and flux are not allowed to penetrate the closed space 17. Thus, a reflow method can be introduced to soldering of the electrodes 14 and the interconnections 22 (FIG. 3).

Further, the connector member 30 according to the present embodiment is attachable to and detachable from the second member 20. In other words, after the electrodes 14 and the interconnections 52 are soldered as illustrated in FIG. 8, the connector member 30 can be attached to the second member 20. That is, since there is no possibility of damaging a joining portion between the optical fiber 43 or the connector member 30 and the fiber-holding member 44 due to the heat generated upon soldering of the electrodes 14 and the interconnections 52, the reflow method can be also introduced to soldering of the electrodes 14 and the interconnections 52.

In addition, as the closed space 17 which contains the light-emitting element 40 and the driver element 41 is air-tightly sealed, even when being used in such an environment like high-temperature and high-pressure, moisture and gas (including air) are not penetrated into the closed space 17. However, depending on usage and manufacturing environments, it is sufficient as long as the closed space 17 is sealed, and thus the closed space 17 may not always be air-tightly sealed.

The present invention is not limited to the foregoing embodiments and various modifications and alterations can be made within the scope of the present invention. For example, the optical element included in the optical transmission module according to the present embodiment is a light-emitting element. However, the optical element includes both a light-emitting element and a light-receiving element. Thus, as to an optical transmission module provided with a light-receiving element in place of a light-emitting element and an optical transmission module provided with both of the light-emitting element and the light-receiving element, such optical transmission modules are also included within a technical scope of the present invention. Note that, if the light-receiving element is provided, an amplifier element for amplifying an output of the light-receiving element is also provided.

Further, in place of an optical fiber, an optical waveguide, which is formed in a film-like manner with flexibility, can be used. Optical fibers and optical waveguides are optical interconnections forming an optical transmission path.

When a reflow soldering and other heating processes are included in the manufacturing process, it is preferable to use inorganic materials as the materials of the first member 10 and the second member 20, but such materials are not limited to inorganic materials. Also, when the materials of the first and second members are inorganic, the inorganic material is not limited to silicon (Si) and a glass material may be used, for example. However, the material of the second member is required to have optical characteristics which transmit light outputted from a light-emitting element or light to be incident on a light-receiving element therethrough.

Figure 9:
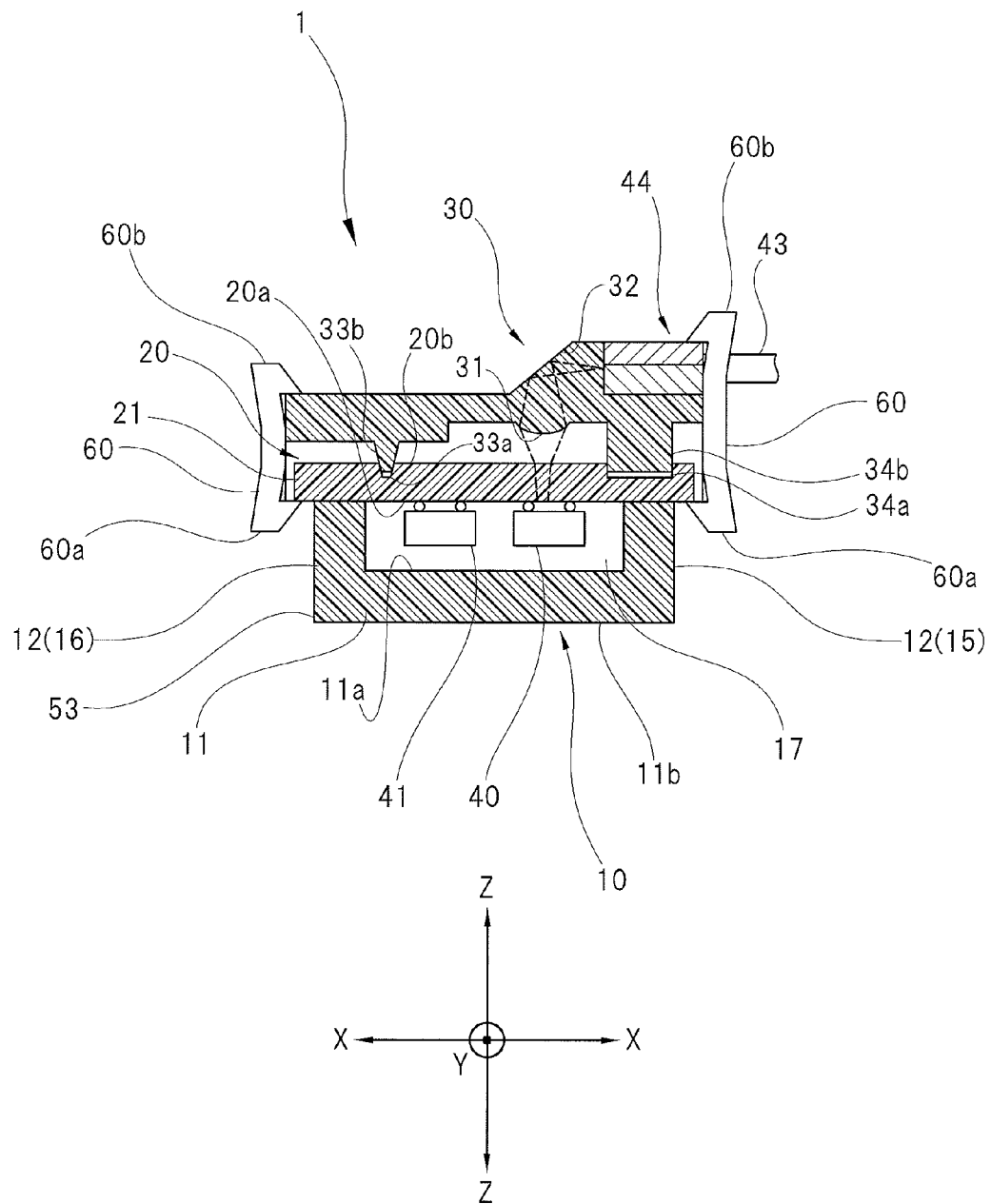
FIG. 9 is a cross-sectional view illustrating another example of the optical transmission module in which the present invention is used.

The material of the connector member is not limited to a resin material, and a glass material may be used, for example. When a glass material or other hard materials are used as the material of the connector member, it is sometimes difficult to integrally form the claws 35a and 35b (FIG. 2) in the above-described embodiment. In such a case, it is preferable to form the third engaging unit by a fixture that is separated from the connector member. FIG. 9 illustrates an example of a fixture 60 is separated from the connector member 30. The illustrated fixture 60 is a clip formed of a synthetic resin and attached to the second member 20 and the connector member 30 across the second member 20 and the connector member 30. More specifically, an engaging protrusion 60a formed in one end of the fixture 60 is engaged with the second member 20, and an engaging protrusion 60b formed in the other end of the fixture 60 is engaged with the fiber-holding member 44 that is fixed to the connector member 30. Note that material of the fixture 60 illustrated in FIG. 9 is not limited to synthetic resin. For example, a fixture having the same or substantially same shape and function as those of the fixture 60 illustrated in FIG. 9 can be formed of a plate metal. Note that, also in such a case that material of the connector member is a resin material, the second member and the connector member can be fixed by a fixture that is separated from the connector member.

Figure 10:
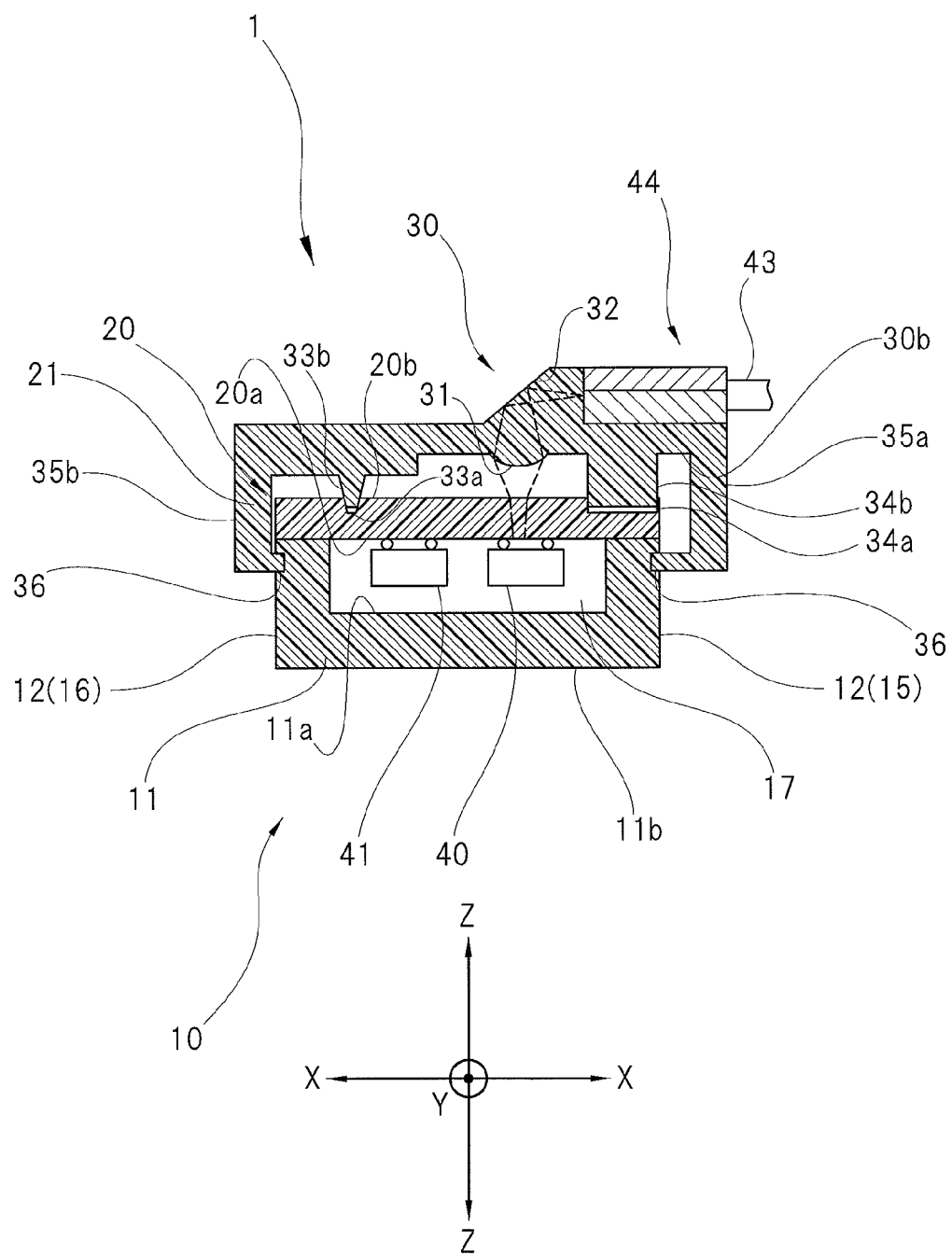
FIG. 10 is a cross-sectional view illustrating another example of the optical transmission module in which the present invention is used.

Moreover, as illustrated in FIG. 10, there is another embodiment that the engaging protrusions 36 of the claws 35a and 35b are engaged with the engaging concave portions formed on the sidewalls 12 of the first member 10, respectively. In such an embodiment, the rim portion 21 (FIG. 4) of the second member 20 can be omitted. That is, the second member 20 can be the same size as the first member 10. Thus, the optical transmission module 1 can be further reduced in size. In addition, since it makes more difficult to apply stress to the joining surface of the first member 10 and the second member 20, the joining reliability is improved.

A collimate lens may be provided to the second member, and the light-collecting lens 31 (FIG. 4) of the present embodiment may be changed to the collimate lens. By adopting a two-lens system like this, tolerance to position shifting can be improved.

The mounting surface on which the optical transmission module of the present invention is mounted is not limited to a surface of a substrate included in an electronic device. For example, the optical transmission module according to the present invention can be mounted on an electronic component. In this case, a package surface, etc. of the electronic component on which the optical transmission module is mounted is a mounting surface.

What is claimed is:

1. An optical transmission module including an optical element with a photoelectric conversion function, the optical transmission module comprising:
  a first member having a bottom portion and sidewalls, and one surface with an opening;
  a second member joined to each end surface of the sidewalls of the first member and sealing the opening of the first member;
  a connector member, which is attachable to and detachable from the second member, having an optical interconnection connected thereto;
  the optical element mounted on an inner surface of the second member that faces an inner surface of the bottom portion of the first member;
  interconnections formed on the inner surface of the second member and extending inside and outside the first member across the sidewalls of the first member; and
  electrodes formed on outer surfaces of the sidewalls of the first member,
  wherein the second member transmits therethrough at least one of light outputted from the optical element and light to be incident on the optical element,
  the connector member converts a traveling direction of light transmitted through the second member to make the light incident on the connected optical interconnection, or converts a traveling direction of light outputted from the connected optical interconnection to make the light incident on the second member,
  first end portions of the electrodes are electrically connected to end portions of corresponding interconnections extending outside the first member, and
  second end portions of the electrodes are soldered to interconnections or electrodes formed on a mounting surface on which the optical transmission module is mounted.

2. The optical transmission module according to claim 1, comprising a plurality of engaging units for defining a relative positional relationship between the second member and the connector member.

3. The optical transmission module according to claim 2, wherein the connector member is mounted on an outer surface of the second member on a side opposite to the inner surface of the second member,
  the optical transmission module further includes:
  a first engaging unit for defining a relative positional relationship between the second member and the connector member in an X direction that is parallel to the outer surface of the second member;
  a second engaging unit for defining a relative positional relationship between the second member and the connector member in a Y direction that is parallel to the outer surface of the second member and orthogonal to the X direction; and
  a third engaging unit for defining a relative positional relationship between the second member and the connector member in a Z direction that is perpendicular to the outer surface of the second member.

4. The optical transmission module according to claim 3, wherein each of the first engaging unit and the second engaging unit includes a concave and a convex formed respectively on the outer surface of the second member and on a bottom surface of the connector member facing the outer surface, and the third engaging unit is formed integrally with the connector member, and includes a claw that is engageable with and releasable from the second member.

5. The optical transmission module according to claim 4, wherein each of the first engaging unit and the second engaging unit includes a groove that is formed on the outer surface of the second member, and a protrusion that is formed on the bottom surface of the connector member and fitted with the groove, and the claw included in the third engaging unit is elastically deformable to be into a state of being engaged with the second member and a state of being released from engagement with the second member.

6. The optical transmission module according to claim 3, wherein each of the first engaging unit and the second engaging unit includes a concave and a convex formed respectively on the outer surface of the second member, and a bottom surface of the connector member facing the outer surface, and the third engaging unit includes a fixture which is provided across the second member and the connector member, and separated from the connector member.

\* \* \* \* \*